US012700444B2

(12) United States Patent
Lee

(10) Patent No.: US 12,700,444 B2
(45) Date of Patent: Aug. 4, 2026

(54) PUMPING VOLTAGE GENERATING CIRCUIT IN WHICH THE TOTAL PUMPING FORCE IS CONTROLLED IN RESPONSE TO THE SELF-REFRESH CHARGE CONSUMPTION

(71) Applicant: FIDELIX CO., LTD., Seongnam-si (KR)

(72) Inventor: Jae Jin Lee, Gwangju-si (KR)

(73) Assignee: FIDELIX CO., LTD., Seongnam-si (KR)

( * ) Notice: Subject to any disclaimer, the term of this patent is extended or adjusted under 35 U.S.C. 154(b) by 111 days.

(21) Appl. No.: 18/933,955

(22) Filed: Oct. 31, 2024

(65) Prior Publication Data

US 2025/0191631 A1 Jun. 12, 2025

(30) Foreign Application Priority Data

Dec. 8, 2023 (KR) .......................... 10-2023-0177527

(51) Int. Cl.
*G11C 11/406* (2006.01)
*G11C 11/4074* (2006.01)
*G11C 11/4076* (2006.01)

(52) U.S. Cl.
CPC .... *G11C 11/40615* (2013.01); *G11C 11/4074* (2013.01); *G11C 11/4076* (2013.01)

(58) Field of Classification Search
CPC .......... G11C 11/40615; G11C 11/4074; G11C 11/4076; G11C 5/145; G11C 5/147
USPC ........................................................ 365/222
See application file for complete search history.

(56) References Cited

U.S. PATENT DOCUMENTS

2005/0141310 A1* 6/2005 Lee ....................... G11C 11/406
365/222

FOREIGN PATENT DOCUMENTS

| KR | 10-2003-0057825 | 7/2003 | |
| KR | 10-0520138 | 10/2005 | |
| KR | 10-0527593 | 2/2006 | |
| KR | 10-2006-0034367 | 4/2006 | |
| KR | 10-0945931 | 3/2010 | |
| KR | 102534321 B1 * | 5/2023 | ............. G11C 5/145 |

* cited by examiner

*Primary Examiner* — Fernando Hidalgo
(74) *Attorney, Agent, or Firm* — KILE PARK REED & HOUTTEMAN PLLC

(57) ABSTRACT

A pumping voltage generating circuit can include a control information generating block receiving a pumping enable signal and a refresh sequential signal and generating driving force control information, the driving force control information controlled so that a number of pulses of the refresh sequential signal falling within a target pulse number range is generated during the generation of pulses of the pumping enable signal which have the pumping reference number, a pumping generation block generating a pumping voltage with a total pumping force, the total pumping force depending on the data value of the driving force control information, and a level detection block detecting a level of the pumping voltage and generating the pumping enable signal, the pumping enable signal activated when the level of the pumping voltage is outside a target level range, and deactivated when the level of the pumping voltage falls within the target level range.

12 Claims, 11 Drawing Sheets

PUMPING VOLTAGE GENERATING CIRCUIT IN WHICH THE TOTAL PUMPING FORCE IS CONTROLLED IN RESPONSE TO THE SELF-REFRESH CHARGE CONSUMPTION

CROSS-REFERENCE TO RELATED APPLICATION(S)

This application claims priority to and the benefit of Korean Patent Application No. 10-2023-0177527 under 35 U.S.C. § 119, filed on Dec. 8, 2023 in the Korean Intellectual Property Office (KIPO), the entire contents of which are incorporated herein by reference.

BACKGROUND

1. Technical Field

The disclosure relates to a pumping voltage generating circuit, and more particularly, to a semiconductor memory device comprising a pumping voltage generating circuit in which a total pumping force is controlled in response to self-refresh charge consumption.

2. Discussion of Related Art

Generally, semiconductor memory devices use "pumping voltage". In this specification, "pumping voltage" is a voltage having a level higher than the power supply voltage, which is the highest-level voltage provided externally, or a level lower than the ground voltage, which is the lowest-level voltage provided externally, such as a boosted voltage and a word line off voltage. In this case, a pumping voltage such as the boosted voltage is mainly used to drive the word lines of the memory cells. By using this boosted voltage VPP, data stored in the memory cell can be transmitted to the bit lines without loss due to the threshold voltage.

Volatile semiconductor memory devices such as DRAM performs a refresh operation to maintain stored data, and refresh methods include auto-refresh and self-refresh. Here, the self-refresh is performed according to the generation of a self-refresh enter command. That is, when a self-refresh enter command is generated, pulses of the refresh sequential signal are repeatedly generated at a set period. Then, the word lines are sequentially activated in response to the generation of a plurality of pulses of the refresh sequential signal, thereby refreshing the memory cell. In this case, the word line is controlled by the pumping voltage, that is, the boosted voltage.

That is, as the pumping voltage is used for self-refresh, the amount of charge of the pumping voltage is consumed. Since "self-refresh charge consumption" is generated during the self-refresh, a level of the pumping voltage may be changed. In this specification, the amount of charge of the pumping voltage consumed for a one-time generation of pulses of the refresh sequential signal may be referred to as "self-refresh charge consumption".

Most semiconductor memory devices have a built-in pumping voltage generating circuit that generates "pumping voltage". This pumping voltage generating circuit is implemented including a pumping driver that pumps the pumping voltage with its total pumping force in response to activation of the pumping enable signal. In this case, the "total pumping force" means "the ability of the pumping voltage generating circuit to pump the pumping voltage in response to a one-time generation of pulses of the pumping enable signal".

However, when the total pumping force of the pumping driver is excessively small compared to the "self-refresh charge consumption", it takes a long time for the level of the pumping voltage to reach a target level, which may cause a malfunction of the semiconductor memory device. Additionally, if the total pumping force of the pumping driver is excessively large compared to the "self-refresh charge consumption", a so-called "overshoot" in which the level of the pumping voltage is significantly outside of the target level may occur.

Therefore, the pumping voltage generating circuit of the semiconductor memory device needs to have total pumping force to correspond to the self-refresh charge consumption. That is, in the pumping voltage generating circuit of the semiconductor memory device, the total pumping force needs to be controlled to be similar to the self-refresh charge consumption.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein

SUMMARY

The disclosure is directed to a pumping voltage generating circuit of a semiconductor memory device in which a total pumping force is controlled in response to self-refresh charge consumption.

According to an aspect of the disclosure, there is provided a pumping voltage generating circuit of a semiconductor memory device. The semiconductor memory device may include multiple memory cells arranged in a matrix structure formed by multiple word lines and multiple data lines, and the word lines may be sequentially activated in response to the generation of multiple pulses of a refresh sequential signal in a self-refresh operation. The pumping voltage generating circuit of the semiconductor memory device according to the aspect of the disclosure may include a control information generating block that receives a pumping enable signal and the refresh sequential signal and generates driving force control information, wherein the driving force control information is controlled so that a number of pulses of the refresh sequential signal falling within a target pulse number range is generated during the generation of pulses of the pumping enable signal which have a pumping reference number, a pumping generation block that generates a pumping voltage with a total pumping force, wherein the total pumping force depends on a data value of the driving force control information, and a level detection block that detects a level of the pumping voltage and generates the pumping enable signal, wherein the pumping enable signal is activated in case that the level of the pumping voltage is outside a target level range, and is deactivated in case that the level of the pumping voltage falls within the target level range.

The level of the pumping voltage may be higher than a level of a power supply voltage.

The level of the pumping voltage may be lower than a level of a ground voltage.

The control information generating block may include a pulse number monitor that receives the pumping enable signal and the refresh sequential signal and generates a first pulse number confirmation signal, a second pulse number confirmation signal, and a reset pulse signal, wherein the first pulse number confirmation signal is activated in case that the number of generated pulses of the refresh sequential signal is greater than or equal to a first refresh reference number while the pulses of the pumping enable signal which have the pumping reference number are generated, and the second pulse number confirmation signal is activated in case that the number of generated pulses of the refresh sequential signal is greater than or equal to a second refresh reference number while the pulses of the pumping enable signal which have the pumping reference number are generated, the target pulse number range is greater than or equal to the first refresh reference number and less than or equal to the second refresh reference number, and the reset pulse signal is activated as a pulse according to the generation of pulses of the pumping enable signal which have the pumping reference number, and an information generator that receives the first pulse number confirmation signal and the second pulse number confirmation signal and generates the driving force control information, wherein the data value of the driving force control information is controlled based on the first pulse number confirmation signal and the second pulse number confirmation signal, and is updated according to the generation of the pulse of the reset pulse signal.

The pulse number monitor may include a first refresh confirmation part that receives the refresh sequential signal and generates the first pulse number confirmation signal, wherein the first pulse number confirmation signal is activated and held according to the generation of pulses of the refresh sequential signal which have the first refresh reference number while a sampling pulse signal is activated, a second refresh confirmation part that receives the refresh sequential signal and generates the second pulse number confirmation signal, wherein the second pulse number confirmation signal is activated and held according to the generation of pulses of the refresh sequential signal which have the second refresh reference number while the sampling pulse signal is activated, and the second refresh reference number is greater than the first refresh reference number, and a sampling pulse generating part that receives the pumping enable signal and generates the sampling pulse signal, wherein the sampling pulse signal is activated as a pulse in response to the generation of pulses of the pumping enable signal which have the pumping reference number.

The first refresh confirmation part may include a first refresh counting part that counts the generation of pulses of the refresh sequential signal, generates first refresh counting information, and is reset in response to the generation of pulses of the reset pulse signal, a first refresh confirmation part that receives the first refresh counting information, generates a first refresh counting signal, and is reset in response to the generation of pulses of the reset pulse signal, wherein the first refresh counting signal is activated according to the generation of pulses of the refresh sequential signal which have more than the first refresh reference number, and a first sampling part that receives the first refresh counting signal and generates the first pulse number confirmation signal, wherein the first pulse number confirmation signal has a logic state that depends on a logic state of the first refresh counting signal that is sampled and held in response to the generation of pulses of the sampling pulse signal. The second refresh confirmation part may include a second refresh counting part that counts the generation of pulses of the refresh sequential signal, generates second refresh counting information, and is reset in response to the generation of pulses of the reset pulse signal, a second refresh confirmation part that receives the second refresh counting information, generates a second refresh counting signal, and is reset in response to the generation of pulses of the reset pulse signal, wherein the second refresh counting signal is activated according to the generation of pulses of the refresh sequential signal which have more than the second refresh reference number, a second sampling part that receives the second refresh counting signal and generates the second pulse number confirmation signal, wherein the second pulse number confirmation signal has a logic state that depends on a logic state of the second refresh counting signal that is sampled and held in response to the generation of pulses of the sampling pulse signal. The sampling pulse generating part may include a pumping counting part that generates pumping counting information by counting the number of pulses of the pumping enable signal and is reset in response to the generation of pulses of the reset pulse signal, a pumping confirmation part that receives the pumping counting information, generates a pumping counting signal, and is reset in response to the generation of pulses of the reset pulse signal, wherein the pumping counting signal is activated according to the generation of pulses of the pumping enable signal which have more than the pumping reference number, and a sampling pulse generating part that receives the pumping counting signal and generates the sampling pulse signal, wherein the sampling pulse signal is activated as a pulse in response to the activation of the pumping counting signal.

The reset pulse signal may be a signal delayed with respect to the sampling pulse signal.

The driving force control information may include 1-st to m-th driving information bits (where 'm' is a natural number of 2 or more), and i-th driving information bit (where 'i' is a natural number between '2' and 'm') is an upper bit of (i−1)-th driving information bit. The information generator may include 1-st to m-th full adders that each generate its own addition output value and its own output carry value by fully adding its own first input value, its own second input value, and its own input carry value, wherein the own addition output value is a remainder obtained by dividing a sum of the own first input value, the own second input value, and the own input carry value by '2', and the own output carry value is a quotient obtained by dividing the sum of the own first input value, the own second input value, and the own input carry value by '2', and 1-st to m-th information latches that each latch its own information input data and provide the own information input data as its own information output data. The first input value of each of the 1-st to m-th full adders may depend on a data value of the information output data of the 1-st to m-th information latches in response to the activation of an update pulse signal, the second input value of the 1-st full adder may correspond to a first data value according to the activation of the first pulse number confirmation signal and the second pulse number confirmation signal, and may correspond to a second data value according to the deactivation of at least one of the first pulse number confirmation signal and the second pulse number confirmation signal. The second input value of i-th full adder may correspond to the second data value according to the activation of the first pulse number confirmation signal and the second pulse number confirmation signal, and may correspond to the first data value according to the deactivation of at least one of the first pulse number confirmation signal and the second pulse number confirmation signal to "L". The input carry value of the 1-st full adder may correspond to the second data value according to the activation of the first pulse number confirmation signal and the second pulse number confirmation signal, and may correspond to the first data value according to the deactivation of at least one of the first pulse number confirmation signal and the second pulse number confirmation signal. The input carry value of the i-th full adder may correspond to an output carry value of (i−1)-th full adder. The addition output value of each of the 1-st to m-th full adders may be provided as a data value of the information input data of the 1-st to m-th information latches in response to the deactivation of the update pulse signal, and the data value of the information output data of each of the 1-st to m-th information latches may correspond to a data value of the 1-st to m-th driving information bits.

The pumping generation block may include an oscillator that is enabled by the activation of the pumping enable signal and generates a main oscillating signal, wherein the main oscillating signal oscillates on a constant cycle, and a pumping driver that generates the pumping voltage with the total pumping force.

The driving force control information may include 1-st to m-th driving information bits (where 'm' is a natural number of 2 or more), and i-th driving information bit (where 'i' is a natural number between '2' and 'm') is upper bit of (i−1)-th driving information bit. The pumping driver may include 1-st to m-th pumping driving parts, wherein k-th pumping driving part (where 'k' is a natural number between '1' and 'm') is enabled in response to first data value of k-th driving information bit, and generates the pumping voltage by pumping with a k-th partial pumping force according to a pulse of the main oscillating signal. The k-th partial pumping force may be greater than a (k−1)-th partial pumping force, and the total pumping force may be greater than or equal to a sum of 1-st to m-th partial pumping forces.

The k-th partial pumping force may be twice (k−1)-th partial pumping force.

The k-th pumping driving part may include a power pumping node, a pumping capacitor having a side connected to the power pumping node, a control signal generation part that is enabled in response to the first data value of the k-th driving information bit and generates a pumping boosting signal, a pumping pre-charge signal, and a pumping driving signal having a period according to the main oscillating signal, wherein the pumping boosting signal is connected to another side of the pumping capacitor, the pumping pre-charge signal is activated within a deactivation period of the pumping boosting signal, and the pumping driving signal is activated within an activation period of the pumping boosting signal, a pumping pre-charge part that pre-charges the power pumping node to a pumping pre-charge level in response to the activation of the pumping pre-charge signal, and a pumping driving part that provides charge of the power pumping node to the pumping voltage in response to the activation of the pumping driving signal. A capacity of the pumping capacitor of the k-th pumping driving part may be twice a capacity of the pumping capacitor of (k−1)-th pumping driving part.

According to a pumping voltage generating circuit of the disclosure configured as described above, a total pumping force can be controlled to the strength such that the amount of charge supplied to a pumping voltage in a self-refresh operation is similar to self-refresh charge consumption. As a result, a malfunction and an overshoot of a semiconductor memory device can be reduced.

BRIEF DESCRIPTION OF THE DRAWINGS

The above and other aspects, features and advantages of the disclosure will become more apparent to those skilled in the art by describing in detail embodiments thereof with reference to the accompanying drawings, in which:

FIG. 1 is a schematic diagram illustrating a pumping voltage generating circuit of a semiconductor memory device according to an embodiment of the disclosure;

FIG. 8 is a schematic diagram specifically showing the k-th pumping driving part of FIG. 7;

DETAILED DESCRIPTION OF THE EMBODIMENTS

Embodiments of the disclosure will be described in detail below with reference to the accompanying drawings. While the disclosure is shown and described in connection with embodiments thereof, it will be apparent to those skilled in the art that various modifications can be made without departing from the spirit and scope of the disclosure. Thus, the scope of the disclosure is not limited to these particular following embodiments.

The terminology used herein is for the purpose of describing particular embodiments only and is not intended to be limiting. As used herein, the singular forms, such as "a" and "an" are intended to include the plural forms as well, unless the context clearly indicates otherwise. It will be further understood that the terms "comprises" and/or "comprising," "has," "have" and/or "having", and "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

In this specification, the term "data value" is a term that represents the value of an object itself, such as a signal, information, or bit, or of the components included therein. In this case, the "data value" is one of '1' and '0'. Here, '1' may be called a "first data value" or "activation state", and '0' may be called a "second data value" or "deactivation state".

Also, the phrase "activated with pulses" or "generation of pulses" mean that a signal is activated from an inactive state and becomes inactive again after a certain period of time.

Figure 1:
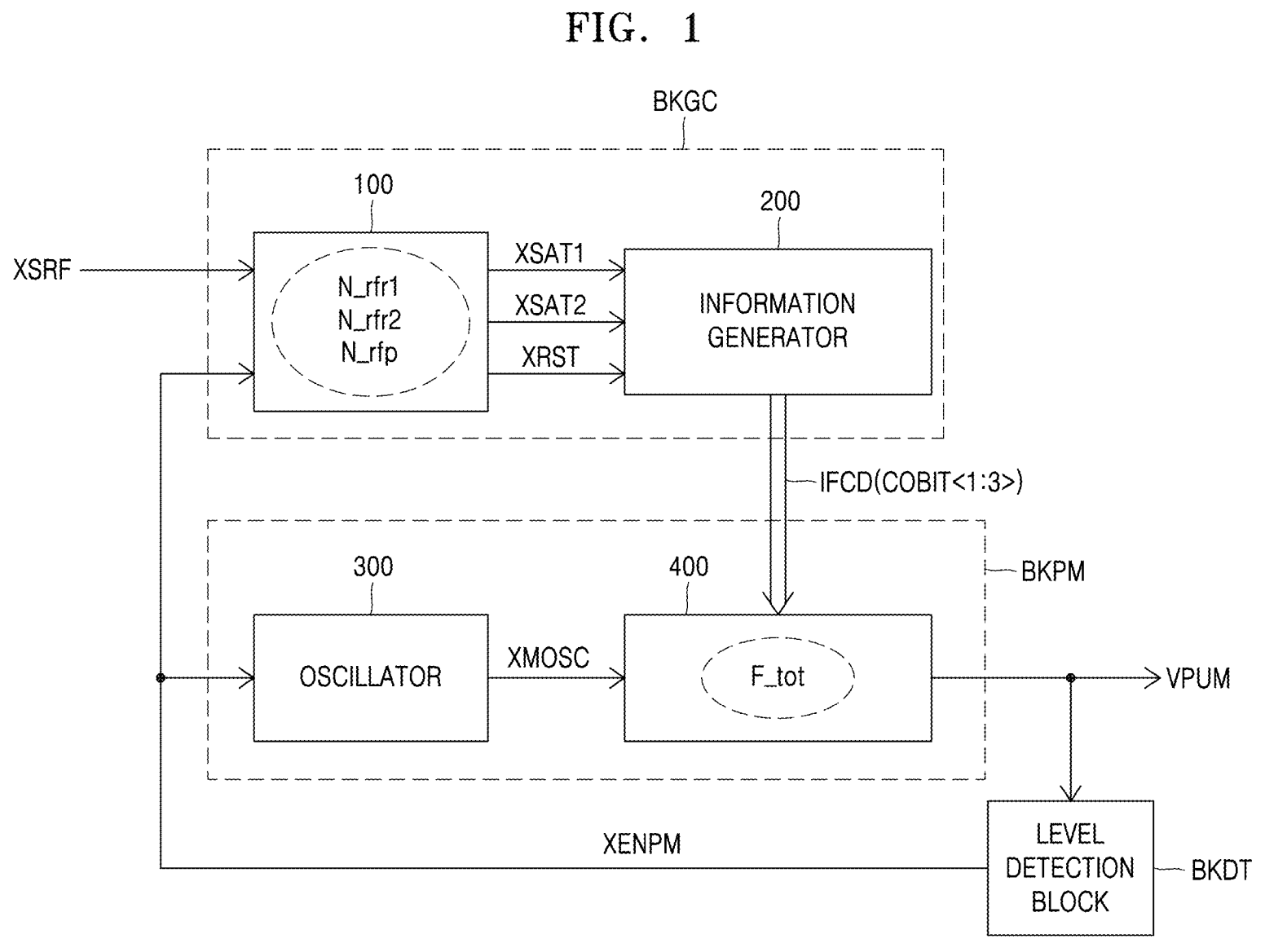
Figure 2:
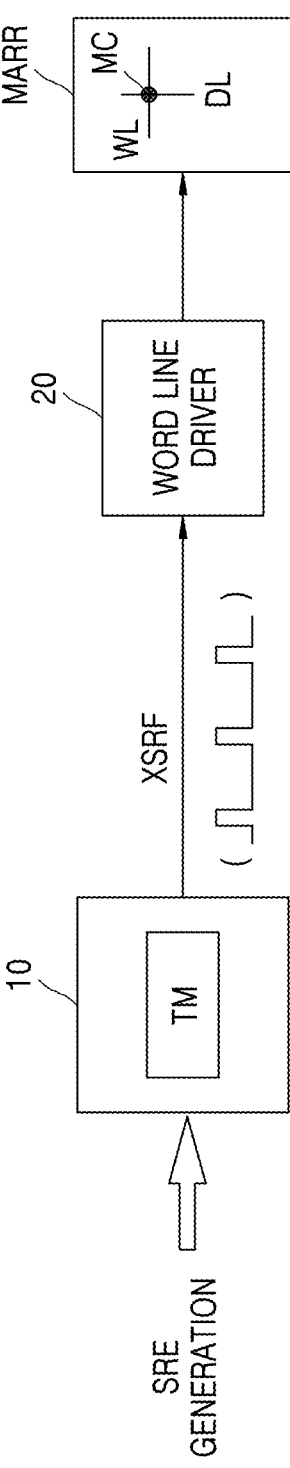
FIG. 2 is a schematic diagram for explaining pulse generation of a memory array related to the pumping voltage generating circuit of the disclosure and the pulse generation of a refresh sequential signal.

FIG. 1 is a schematic diagram illustrating a pumping voltage generating circuit of a semiconductor memory device according to an embodiment of the disclosure. FIG. 2 is a schematic diagram for explaining pulse generation of a memory array related to the pumping voltage generating circuit of the disclosure and the pulse generation of a refresh sequential signal.

As shown in FIG. 2, the semiconductor memory device includes multiple memory cells MC arranged in a matrix structure formed by multiple word lines WL and multiple data lines DL. The word lines WL may be sequentially activated in response to the generation of multiple pulses of a refresh sequential signal XSRF in a self-refresh operation.

For example, the 1-st word line WL may be activated in response to the generation of the 1-st pulse of the refresh sequential signal XSRF, and the 2-nd word line WL may be activated in response to the generation of the 2-nd pulse of the refresh sequential signal XSRF.

In this case, data stored in the memory cells MC may be refreshed.

The refresh sequential signal XSRF may be a signal received from a refresh sequential signal generator 10 including a built-in timer TM and provided to a word line driver 20. The refresh sequential signal XSRF may be activated with pulses of a certain period when a self-refresh enter command is issued.

The pumping voltage generating circuit of the disclosure may generate the pumping voltage VPUM. In this embodiment, the pumping voltage VPUM may be a "boosted voltage" at a higher level than the power supply voltage VCC. In this case, the power supply voltage VCC may be the highest-level voltage supplied from the outside. The pumping voltage VPUM may be a voltage at a level lower than the ground voltage VSS. In this case, the ground voltage VSS may be the lowest-level voltage supplied from the outside.

In this specification, for convenience of explanation, the pumping voltage VPUM may be described assuming that it is a "boosted voltage".

Referring to FIG. 1, the pumping voltage generating circuit according to an embodiment of the disclosure may include a control information generating block BKGC, a pumping generation block BKPM, and a level detection block BKDT. In this case, the pumping generation block BKPM may generate the pumping voltage VPUM with a total pumping force F-tot.

Before describing the pumping voltage generating circuit of FIG. 1 in detail, in the self-refresh operation of a semiconductor memory device, the ideal strength of the total pumping force F_tot and pumping of the pumping generation block BKPM are considered.

Ideally, the total pumping force F_tot may have a strength at which an amount of charge equal to the amount of charge consumed in the pumping voltage VPUM is supplied. In this case, the pumping voltage VPUM may have a stable level despite the consumption of charge.

The pumping generation block BKPM may be designed to compensate for the amount of charge consumed by pumping resulting from the generation of one pulse of a pumping enable signal XENPM.

According to an ideal design, in a self-refresh operation, the pulse period of the pumping enable signal XENPM and the pulse period of the refresh sequential signal XSRF may be the same.

However, in this embodiment, the difference between the number of pulses of the pumping enable signal XENPM and the number of pulses of the refresh sequential signal XSRF generated within a certain time may be controlled within an allowable error range. This may be in consideration of the fact that it is very difficult to exactly match the pulse period of the pumping enable signal XENPM and the pulse period of the refresh sequential signal XSRF.

Referring to FIG. 1, the control information generating block BKGC may receive the pumping enable signal XENPM and the refresh sequential signal XSRF and may generate driving force control information IFCD.

Figure 3:
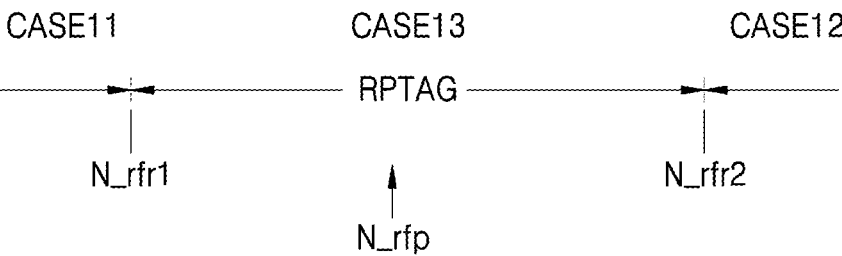
FIG. 3 is a schematic diagram for explaining the reference range of the number of pulses generated in the refresh sequential signal of FIG. 1.

The driving force control information IFCD may be controlled so that the number of pulses of the refresh sequential signal XSRF generated during the generation of pulses of the pumping enable signal XENPM which have a pumping reference number N_rfp falls within a target pulse number range RPTAG (see FIG. 3).

FIG. 3 is a schematic diagram for explaining the reference range of the number of pulses generated in the refresh sequential signal of FIG. 1. In this embodiment, as shown in FIG. 3, the "target pulse number range RPTAG" may be greater than or equal to a first refresh pulse number N_rfr1 and less than or equal to a second refresh pulse number N_rfr2. In an embodiment, the pumping reference number N_rfp falls within the target pulse number range RPTAG.

In this embodiment, it can be understood that the difference between the number of pulses of the pumping enable signal XENPM and the number of pulses of the refresh sequential signal XSRF generated within a certain time may be controlled within an allowable error range, when the number of pulses of the refresh sequential signal XSRF falls within the target pulse number range RPTAG.

The driving force control information IFCD may include 1-st to m-th driving information bits CDBIT. Here 'm' is a natural number of 2 or more. In this embodiment, 'm' is assumed to be '3'. For example, in this embodiment, it is assumed that the driving force control information IFCD may include the 1-st to the 3-rd driving information bits CDBIT<1:3>.

In this embodiment, the i-th driving information bit may be the upper bit of the (i−1)-th driving information bit. Here, 'i' is a natural number between '2' and 'm'. For example, the 2-nd driving information bit CDBIT<2> may be the upper bit of the 1-st driving information bit CDBIT<1>, and the 3-rd driving information bit CDBIT<3> may be the upper bit of the 2-nd driving information bit CDBIT<2>.

The control information generating block BKGC may specially include a pulse number monitor 100 and an information generator 200.

The pulse number monitor 100 may receive the pumping enable signal XENPM and the refresh sequential signal XSRF. The pulse number monitor 100 may generate a first pulse number confirmation signal XSTA1, a second pulse number confirmation signal XSTA2, and a reset pulse signal XRST.

When the number of generated pulses of the refresh sequential signal XSRF is greater than or equal to a first refresh reference number N-rfr1 while the pulses of the pumping enable signal XENPM which have the pumping reference number N_rfp are generated, the first pulse number confirmation signal XSTA1 may be activated to "H".

When the number of generated pulses of the refresh sequential signal XSRF is greater than or equal to a second refresh reference number N-rfr2 while the pulses of the pumping enable signal XENPM which have the pumping reference number N_rfp are generated, the second pulse number confirmation signal XSTA2 may be activated to "H".

The reset pulse signal XRST may be activated as a pulse according to the generation of pulses of the pumping enable signal XENPM which have the pumping reference number N_rfp.

Figure 4:
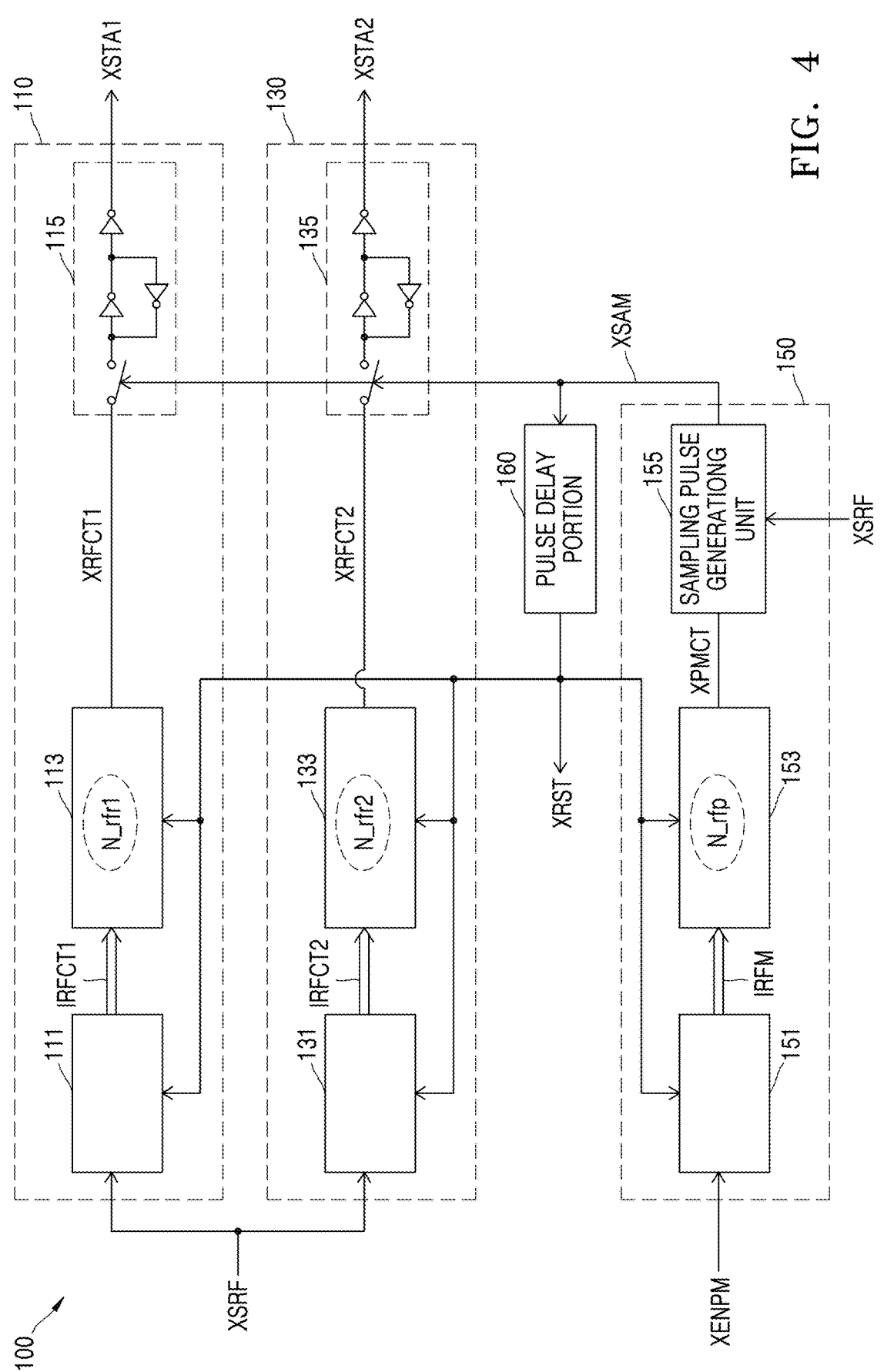
FIG. 4 is a schematic diagram specifically showing the pulse number monitor of FIG. 1.

FIG. 4 is a schematic diagram specifically showing the pulse number monitor 100 of FIG. 1. Referring to FIG. 4, the pulse number monitor 100 may specifically include a first refresh confirmation part 110, a second refresh confirmation part 130, and a sampling pulse generating part 150.

The first refresh confirmation part 110 may receive the refresh sequential signal XSRF and may generate the first pulse number confirmation signal XSTA1. In this case, the first pulse number confirmation signal XSTA1 may be activated to "H" and be held according to the generation of pulses of the refresh sequential signal XSRF which have the first refresh reference number N_rfr1 while a sampling pulse signal XSAM is activated to "H".

The first refresh confirmation part 110 may more specifically include a first refresh counting part 111, a first refresh confirmation part 113, and a first sampling part 115.

The first refresh counting part 111 may count generation of pulses of the refresh sequential signal XSRF and may generate first refresh counting information IRFCT1. The first refresh counting part 111 may be reset in response to generation of pulses of the reset pulse signal XRST.

The first refresh confirmation part 113 may receive the first refresh counting information IRFCT1 and may generate a first refresh counting signal XRFCT1. The first refresh confirmation part 113 may be reset in response to generation of pulses of the reset pulse signal XRST. In this case, the first refresh counting signal XRFCT1 may be activated according to the generation of pulses of the refresh sequential signal XSRF which have more than the first refresh reference number N_rfr1.

The first sampling part 115 may receive the first refresh counting signal XRFCT1 and may generate the first pulse number confirmation signal XSTA1. In this case, the first pulse number confirmation signal XSTA1 may have a logic state that depends on the logic state of the first refresh counting signal XRFCT1, which is sampled and held in response to generation of pulses of the sampling pulse signal XSAM. In this embodiment, the first pulse number confirmation signal XSTA1 and the first refresh counting signal XRFCT1 may have a same logic state, and the first refresh counting signal XRFCT1 may be sampled and held in response to generation of pulses of the sampling pulse signal XSAM.

The second refresh confirmation part 130 may receive the refresh sequential signal XSRF and may generate the second pulse number confirmation signal XSTA2. In this case, the second pulse number confirmation signal XSTA2 may be activated to "H" and held according to the generation of pulses of the refresh sequential signal XSRF which have the second refresh reference number N_rfr2 while the sampling pulse signal XSAM is activated to "H".

The second refresh confirmation part 130 may more specifically include a second refresh counting part 131, a second refresh confirmation part 133, and a second sampling part 135.

The second refresh counting part 131 may count pulse generation of the refresh sequential signal XSRF and may generate second refresh counting information IRFCT2. The second refresh counting part 131 may be reset in response to generation of pulses of the reset pulse signal XRST.

The second refresh confirmation part 133 may receive the second refresh counting information IRFCT2 and may generate a second refresh counting signal XRFCT2. The second refresh confirmation part 133 may be reset in response to generation of pulses of the reset pulse signal XRST. In this case, the second refresh counting signal XRFCT2 may be activated according to the generation of pulses of the refresh sequential signal XSRF which have more than the second refresh reference number N_rfr2.

The second sampling part 135 may receive the second refresh counting signal XRFCT2 and may generate the second pulse number confirmation signal XSTA2. In this case, the second pulse number confirmation signal XSTA2 may have a logic state that depends on the logic state of the second refresh counting signal XRFCT2, which is sampled and held in response to generation of pulses of the sampling pulse signal XSAM. In this embodiment, the second pulse number confirmation signal XSTA2 and the second refresh counting signal XRFCT2 may have a same logic state, and the second refresh counting signal XRFCT2 may be sampled and held in response to generation of pulses of the sampling pulse signal XSAM.

The sampling pulse generating part 150 may receive the pumping enable signal and may generate the sampling pulse signal XSAM. In this case, the sampling pulse signal XSAM may be activated as a pulse in response to generation of pulses of the pumping enable signal XENPM which have the pumping reference number N_rfp.

The sampling pulse generating part 150 may more specifically include a pumping counting part 151, a pumping confirmation part 153, and a sampling pulse generating part 155.

The pumping counting part 151 may generate pumping counting information IFPM by counting generation of pulses of the pumping enable signal XENPM. The pumping counting part 151 may be reset in response to generation of pulses of the reset pulse signal XRST.

The pumping confirmation part 153 may receive the pumping counting information IFPM and may generate a pumping counting signal XPMCT. The pumping confirmation part 153 may be reset in response to generation of pulses of the reset pulse signal XRST. In this case, the pumping counting signal XPMCT may be activated according to the generation of pulses of the pumping enable signal XENPM which have more than the pumping reference number N_rfp.

The sampling pulse generating part 155 may receive the pumping counting signal XPMCT and may generate the sampling pulse signal XSAM. In this case, the sampling pulse signal XSAM may be activated to "H" as a pulse, in response to activation of the pumping counting signal XPMCT to "H".

The pulse delay part 160 may delay the sampling pulse signal XSAM to generate the reset pulse signal XRST.

Referring again to FIG. 1, the information generator 200 may receive the first pulse number confirmation signal XSTA1 and the second pulse number confirmation signal XSTA2 and may generate the driving force control information IFCD. In this case, the data value of the driving force control information IFCD may be controlled based on the first pulse number confirmation signal XSTA1 and the second pulse number confirmation signal XSTA2. The data value of the driving force control information IFCD may be updated according to generation of pulses of the reset pulse signal XRST.

Figure 5:
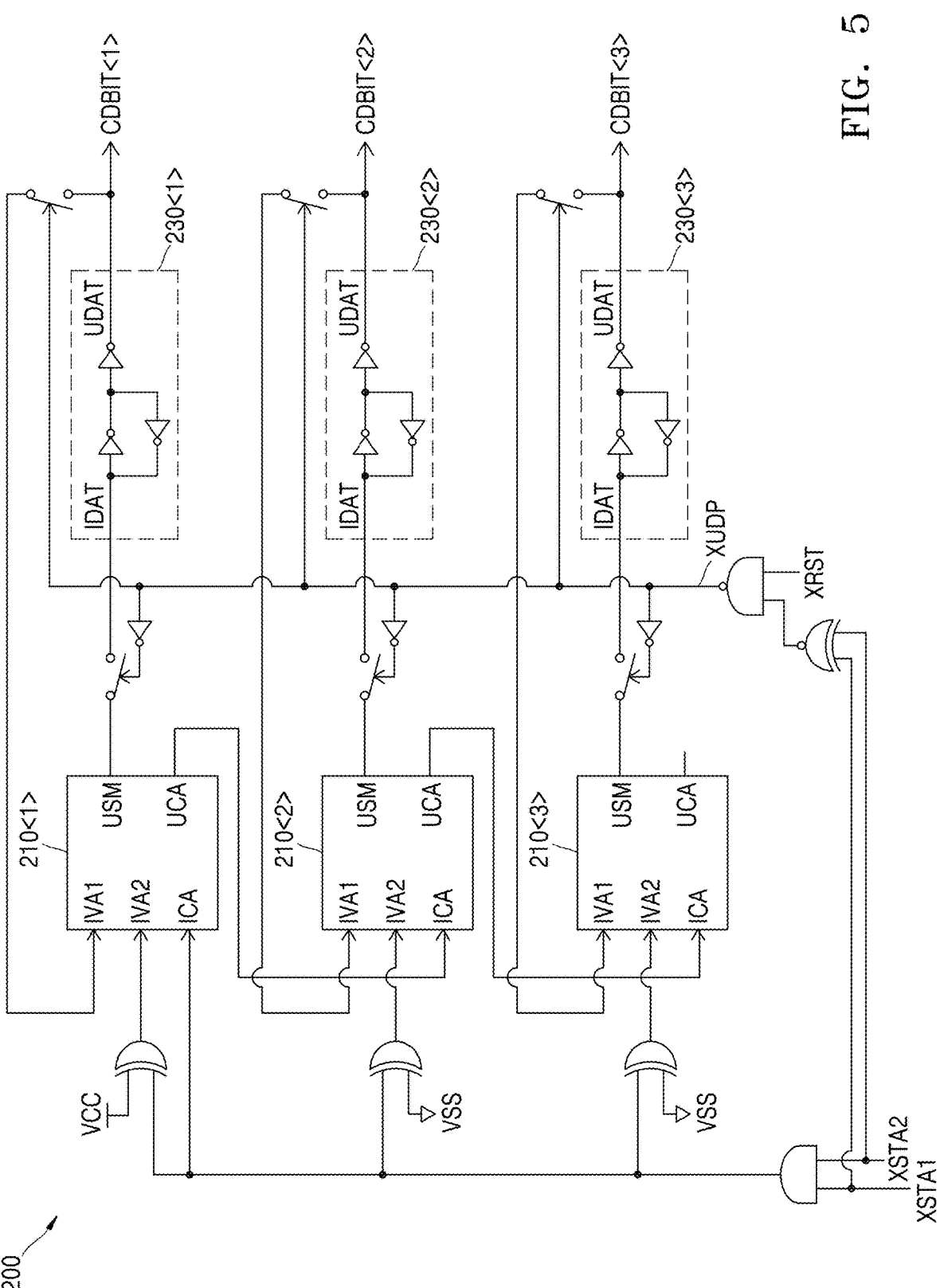
FIG. 5 is a schematic diagram specifically showing the information generator of FIG. 1.

FIG. 5 is a schematic diagram specifically showing the information generator 200 of FIG. 1. Referring to FIG. 5, the information generator 200 may include 1-st to m-th full adders and 1-st to m-th information latches. In this embodiment, 'm' is assumed to be '3'. For example, the information generator 200 may include 1-st to 3-rd full adders 210<1:3> and 1-st to 3-th information latches 230<1:3>.

Each of the 1-st to 3-rd full adders 210<1:3> may generate its own addition output value USM and its own output carry value UCA by fully adding its first input value IVA1, its second input value IVA2, and its input carry value ICA.

Figure 6:
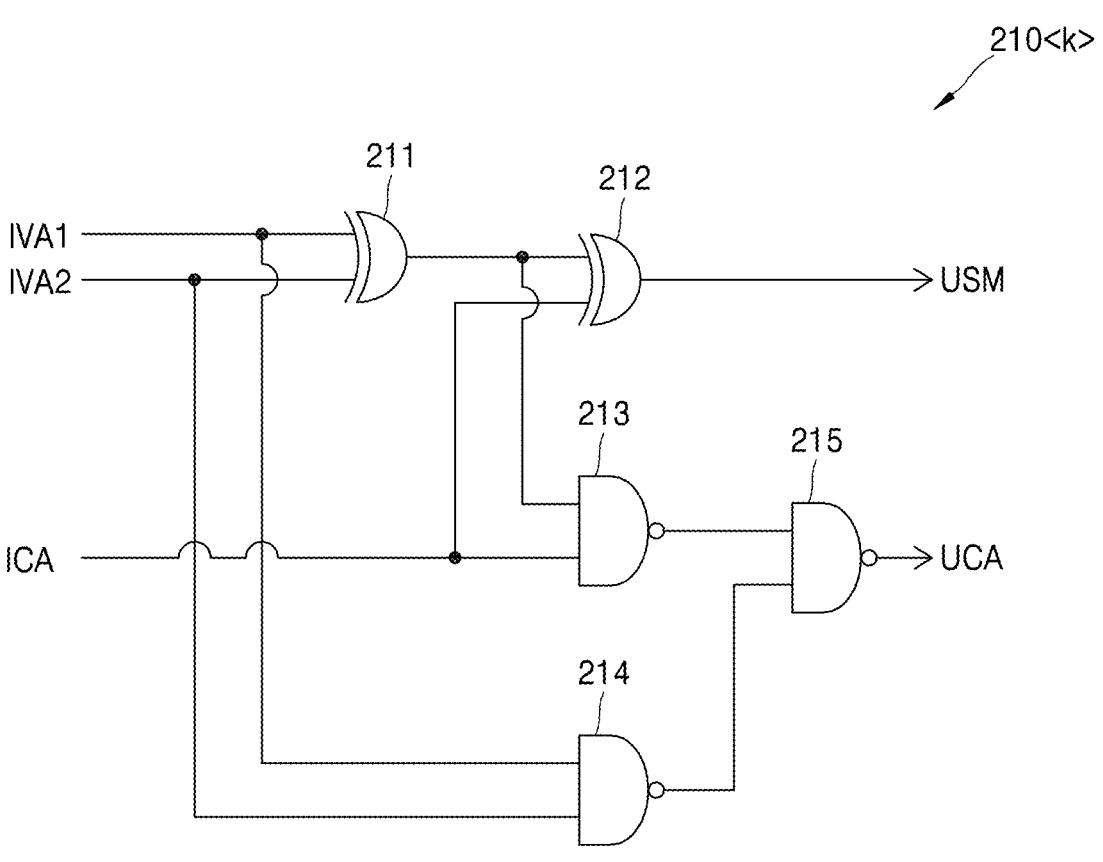
FIG. 6 is a schematic diagram specifically showing the k-th full adder of FIG. 5.

FIG. 6 is a schematic diagram specifically showing the k-th full adder 210<k> of FIG. 5. Here, 'k' is a natural number greater than or equal to '1' and less than or equal to 'm', e.g., a natural number greater than or equal to '1' and less than or equal to '3'. Referring to FIG. 6, the k-th full adder 210<k> may be implemented with two exclusive OR gates 211, 212 and three NAND gates 213, 214, 215.

In this case, in each of the 1-st to 3-rd full adders 210<1:3>, its own addition output value USM and its own output carry value UCA for its first input value IVA1, its second input value IVA2, and its input carry value ICA are as shown in (Table 1).

TABLE 1

| IVA1 | IVA2 | ICA | USM | UCA |
|------|------|-----|-----|-----|
| 0    | 0    | 0   | 0   | 0   |
| 0    | 1    | 0   | 1   | 0   |
| 1    | 0    | 0   | 1   | 0   |
| 1    | 1    | 0   | 0   | 1   |
| 0    | 0    | 1   | 1   | 0   |
| 0    | 1    | 1   | 0   | 1   |
| 1    | 0    | 1   | 0   | 1   |
| 1    | 1    | 1   | 1   | 1   |

For example, in each of the 1-st to 3-rd full adders 210<1:3>, the own addition output value USM may be the remainder obtained by dividing the sum of the own first input value IVA1, the own second input value IVA2, and the own input carry value ICA by '2'. The own output carry value UCA may be the quotient obtained by dividing the sum of the own first input value IVA1, the own second input value IVA2, and the own input carry value ICA '2'.

Each of the 1-st to 3-rd information latches 230<1:3> may latch its own information input data IDAT and provide it as its own information output data UDAT.

In this case, the first input value IVA1 of each of the 1-st to 3-rd full adders 210<1:3> may depend on the data value of the information output data UDAT of the corresponding the 1-st to 3-rd information latches 230<1:3> in response to the activation of an update pulse signal XUDP to "H".

For example, when the update pulse signal XUDP is activated to "H", the first input value IVA1 of the 1-st full adder 210<1> may be the same as the data value of the information output data UDAT of the 1-st information latch 230<1>, the first input value IVA1 of the 2-nd full adder 210<2> may be the same as the data value of the information output data UDAT of the 2-nd information latch 230<2>, and the first input value IVA1 of the 3-rd full adder 210<3> may be the same as the data value of the information output data UDAT of the 3-rd information latch 230<3>.

The second input value IVA2 of the 1-st full adder 210<1> may correspond to the first data value according to activation of the first pulse number confirmation signal XSTA1 and the second pulse number confirmation signal XSTA2 to "H". The second input value IVA2 of the 1-st full adder 210<1> may correspond to the second data value according to deactivation of at least one of the first pulse number confirmation signal XSTA1 and the second pulse number confirmation signal XSTA2 to "L".

In this embodiment, the first data value may be a data value of '1', and the second data value may be a data value of '0'.

The second input value IVA2 of the 2-nd full adder 210<2> may correspond to the second data value according to activation of the first pulse number confirmation signal XSTA1 and the second pulse number confirmation signal XSTA2 to "H". The second input value IVA2 of the 2-nd full adder 210<2> may correspond to the first data value according to deactivation of at least one of the first pulse number confirmation signal XSTA1 and the second pulse number confirmation signal XSTA2 to "L".

The second input value IVA2 of the 3-rd full adder 210<3> may correspond to the second data value according to activation of the first pulse number confirmation signal XSTA1 and the second pulse number confirmation signal XSTA2 to "H". The second input value IVA2 of the 3-rd full adder 210<3> may correspond to the first data value according to deactivation of at least one of the first pulse number confirmation signal XSTA1 and the second pulse number confirmation signal XSTA2 to "L".

The input carry value ICA of the 1-st full adder 210<1> may correspond to the second data value according to activation of the first pulse number confirmation signal XSTA1 and the second pulse number confirmation signal XSTA2 to "H". The input carry value ICA of the 1-st full adder 210<1> may correspond to the first data value according to deactivation of at least one of the first pulse number confirmation signal XSTA1 and the second pulse number confirmation signal XSTA2 to "L".

The input carry value ICA of the 2-nd full adder 210<2> may correspond to the output carry value UCA of the 1-st full adder 210<1>, and the input carry value ICA of the 3-rd full adder 210<3> may correspond to the output carry value UCA of the 2-nd full adder 210<2>. The addition output value USM of each of the 1-st to 3-rd full adders 210<1:3> may be provided as a data value of the information input data IDAT of the corresponding the 1-st to 3-rd information latches 230<1:3> in response to deactivation of the update pulse signal XUDP to "L".

For example, when the update pulse signal XUDP is deactivated to "L", the addition output value USM of the 1-st full adder 210<1> may be provided as a data value of the information input data IDAT of the 1-st information latch 230<1>, the addition output value USM of the 2-nd full adder 210<2> may be provided as a data value of the information input data IDAT of the 2-nd information latch 230<2>, and the addition output value USM of the 3-rd full adder 210<3> may be provided as a data value of the information input data IDAT of the 3-rd information latch 230<3>.

The data values of the information output data UDAT of the 1-st to 3-rd information latches 230<1:3> may correspond to the data values of the 1-st to 3-rd driving information bits CDBIT<1:3>, respectively.

For example, the 1-st driving information bit CDBIT<1> and the information output data UDAT of the 1-st information latch 230<1> may have a same data value, the 2-nd driving information bit CDBIT<2> and the information output data UDAT of the 2-nd information latch 230<2> may have a same data value, and the 3-rd driving information bit CDBIT<3> and the information output data UDAT of the 3-rd information latch 230<3> may have a same data value.

In this specification, each signal or bit may be activated as "H" when it is the first data value, e.g., a data value of '1'. Each signal or bit may be deactivated as "L" when it is the second data value, e.g., a data value of '0'.

Referring again to FIG. 1, the pumping generation block BKPM may generate the pumping voltage VPUM on a pumping supply node with the total pumping force F_tot.

The pumping generation block BKPM may specifically include an oscillator 300 and a pumping driver 400.

The oscillator 400 may be enabled by activation of the pumping enable signal XENPM to "H", and may generate a main oscillating signal XMOSC. The main oscillating signal XMOSC may oscillate on a constant cycle.

The implementation of the above oscillator 300 may be understood by those skilled in the art. Therefore, in this specification, for the sake of simplicity, a detailed description thereof is omitted.

The pumping driver 400 may generate the pumping voltage VPUM on the pumping supply node with the total pumping force F_tot.

Figure 7:
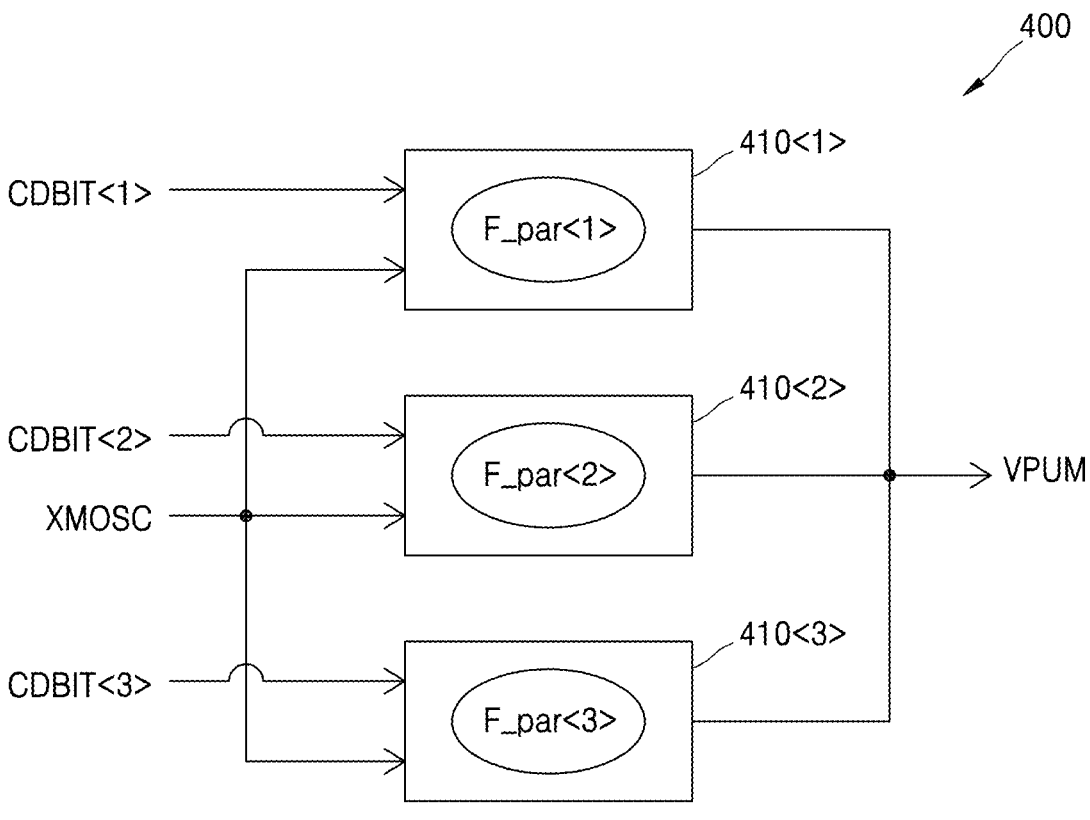
FIG. 7 is a schematic diagram specifically showing the pumping driver of FIG. 1.

FIG. 7 is a schematic diagram specifically showing the pumping driver 400 of FIG. 1. Referring to FIG. 7, the pumping driver 400 may include 1-st to m-th pumping driving parts. In this embodiment, 'm' is assumed to be '3'. For example, the pumping driver 400 may include a 1-st pumping driving part 410<1>, a 2-nd pumping driving part 410<2> and a 3-rd pumping driving part 410<3>.

The 1-st pumping driving part 410<1> may be enabled in response to the first data value (e.g. a data value of '1') of the 1-st driving information bit CDBIT<1>, and may generate the pumping voltage VPUM by pumping with a 1-st partial pumping force F_par<1> according to the pulse of the main oscillating signal XMOSC.

The 2-nd pumping driving part 410<2> may be enabled in response to the first data value (e.g. a data value of '1') of the 2-nd driving information bit CDBIT<2>, and may generate the pumping voltage VPUM by pumping with a 2-nd partial pumping force F_par<2> according to the pulse of the main oscillating signal XMOSC.

The 3-rd pumping driving part 410<3> may be enabled in response to the first data value (e.g. a data value of '1') of the 3-rd driving information bit CDBIT<3>, and may generate the pumping voltage VPUM by pumping with a 3-rd partial pumping force F_par<3> according to the pulse of the main oscillating signal XMOSC.

The total pumping force F_tot may be greater than or equal to the sum of the 1-st to 3-rd partial pumping forces F_par<1:3>.

The 2-nd partial pumping force F_par<2> may be greater than the 1-st partial pumping force F_par<1>, and the 3-rd partial pumping force F_par<3> may be greater than the 2-nd partial pumping force F_par<2>.

In an embodiment, the 2-nd partial pumping force F_par<2> may be twice the 1-st partial pumping force F_par<1>, and the 3-rd partial pumping force F_par<3> may be twice the 2-nd partial pumping force F_par<2>.

Figure 8:
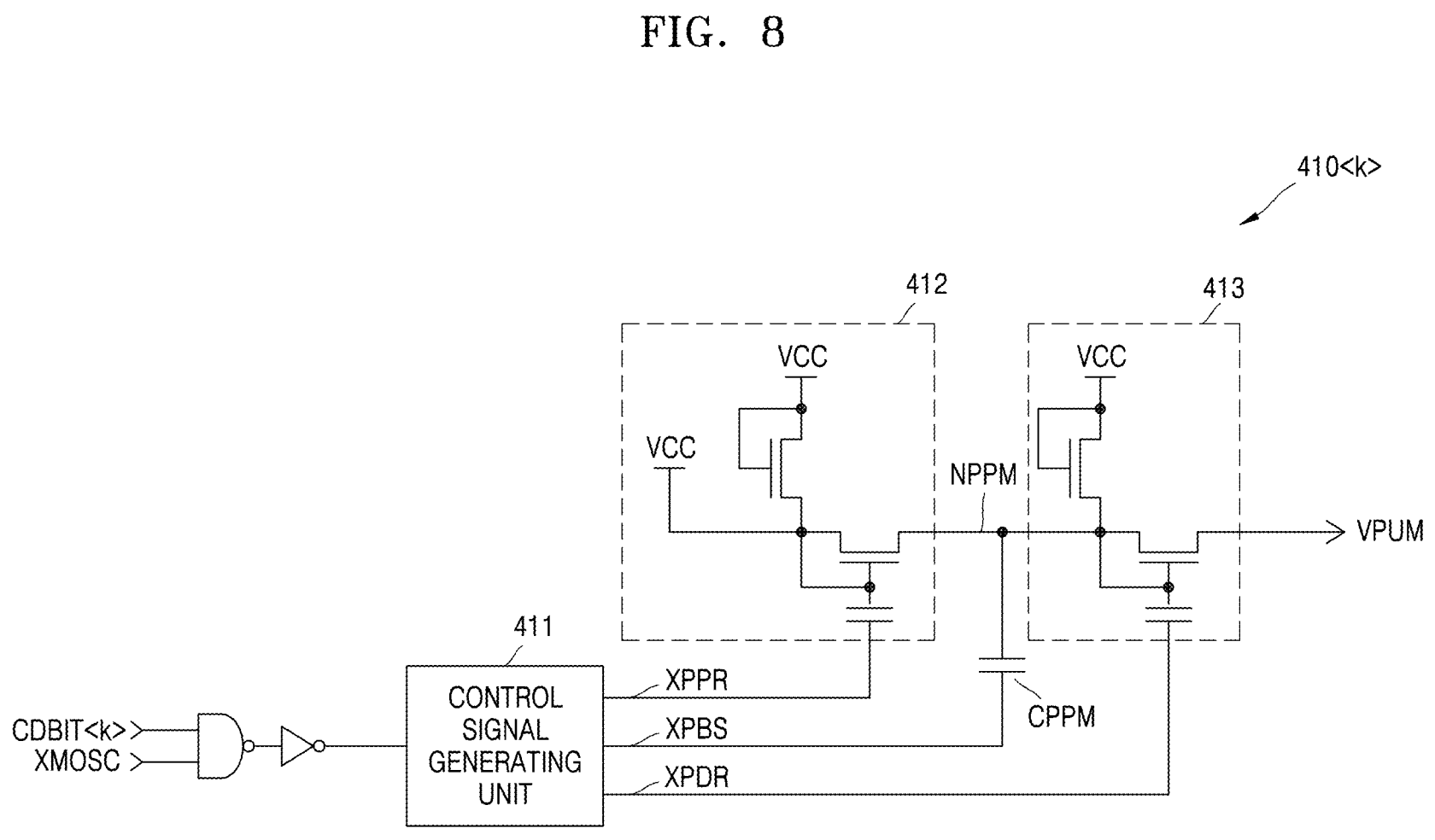
Figure 9:
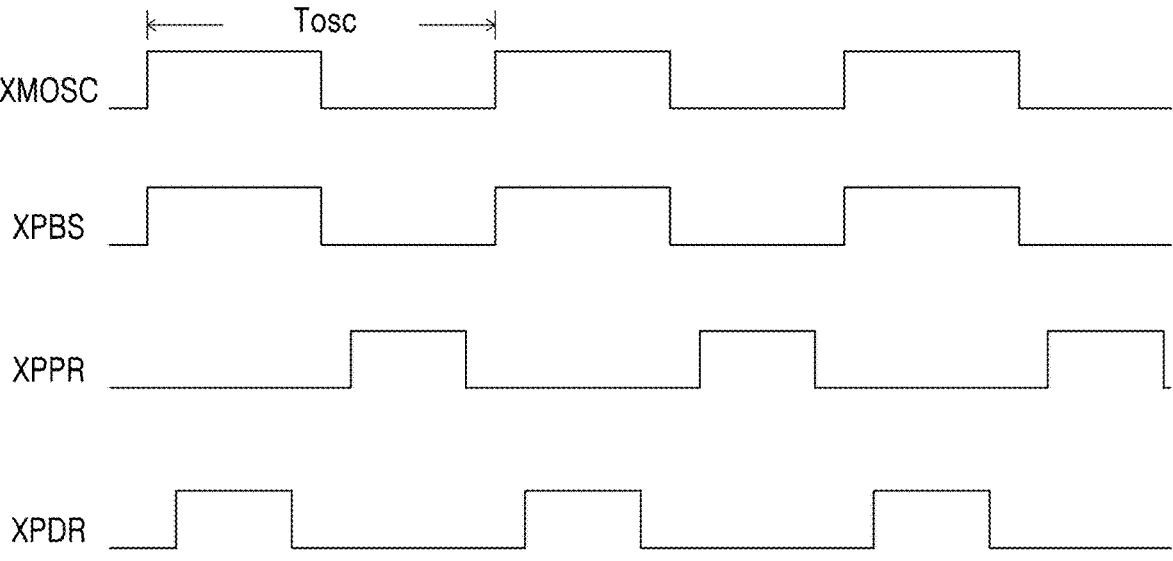
FIG. 9 is a schematic diagram for explaining signals driving the k-th pumping driving part of FIG. 8.

FIG. 8 is a schematic diagram specifically showing the k-th pumping driving part 410<k> of FIG. 7. FIG. 9 is a schematic diagram for explaining signals driving the k-th pumping driving part of FIG. 8. Referring to FIG. 8, the k-th pumping driving part 410<k> may specifically include a power pumping node NPPM, a pumping capacitor CPPM, a control signal generation part 411, a pumping pre-charge part 412, and a pumping driving part 413.

The pumping capacitor CPPM may have a side connected to the power pumping node NPPM.

The control signal generation part 411 may be enabled in response to the first data value of the k-th driving information bit CDBIT<k>, and may generate a pumping boosting signal XPBS, a pumping pre-charge signal XPPR, and a pumping driving signal XPDR.

As shown in FIG. 9, the pumping boosting signal XPBS, the pumping pre-charge signal XPPR, and the pumping driving signal XPDR may have a period Tosc according to the main oscillating signal XMOSC.

The pumping boosting signal XPBS and the main oscillating signal XMOSC may have a same duty. The pumping boosting signal XPBS may be applied to another side of the pumping capacitor CPPM.

The pumping pre-charge signal XPPR may be activated to "H" within a period of deactivation of the pumping boosting signal XPBS to "L", and the pumping driving signal XPDR may be activated to "H" within a period of activation of the pumping boosting signal XPBS to "H".

The pumping pre-charge part 412 may pre-charge the power pumping node NPPM to a "pumping pre-charge level" in response to activation of the pumping pre-charge signal XPPR to "H". In this embodiment, the "power pre-charge level" may correspond to the power supply voltage VCC.

The pumping driving part 413 may be driven to provide charge of the power pumping node NPPM to the pumping voltage VPUM in response to activation of the pumping driving signal XPDR to "H".

According to the above-described the k-th pumping driving part 410<k>, when the pumping boosting signal XPBS is activated to "H", the level of the voltage of the power pumping node NPPM may be higher than that of the power supply voltage VCC. The voltage of the power pumping node NPPM, which has been raised to a high level, may be transmitted to the pumping voltage VPUM, thereby raising the level of the pumping voltage VPUM.

In this case, the k-th partial pumping driving power F_par<k> of the k-th pumping driving part 410<k> may depend on the capacity of the pumping capacitor CPPM.

In an embodiment, the capacity of the pumping capacitor CPPM of the k-th pumping driving part 410<k> may be twice that of the pumping capacitor CPPM of the (k−1)-th pumping driving part 410<k−1>.

Referring again to FIG. 1, the level detection block BKDT may detect the level of the pumping voltage VPUM, and may generate the pumping enable signal XENPM.

In this case, the pumping enable signal XENPM may be activated to "H" when the level of the pumping voltage VPUM is outside a target level range, and may be deactivated to "L" when the level of the pumping voltage VPUM is within the target level range.

If the pumping voltage VPUM is a "boosted voltage", the "target level range" may be a voltage level range above a certain target level VTAG.

Figure 10:
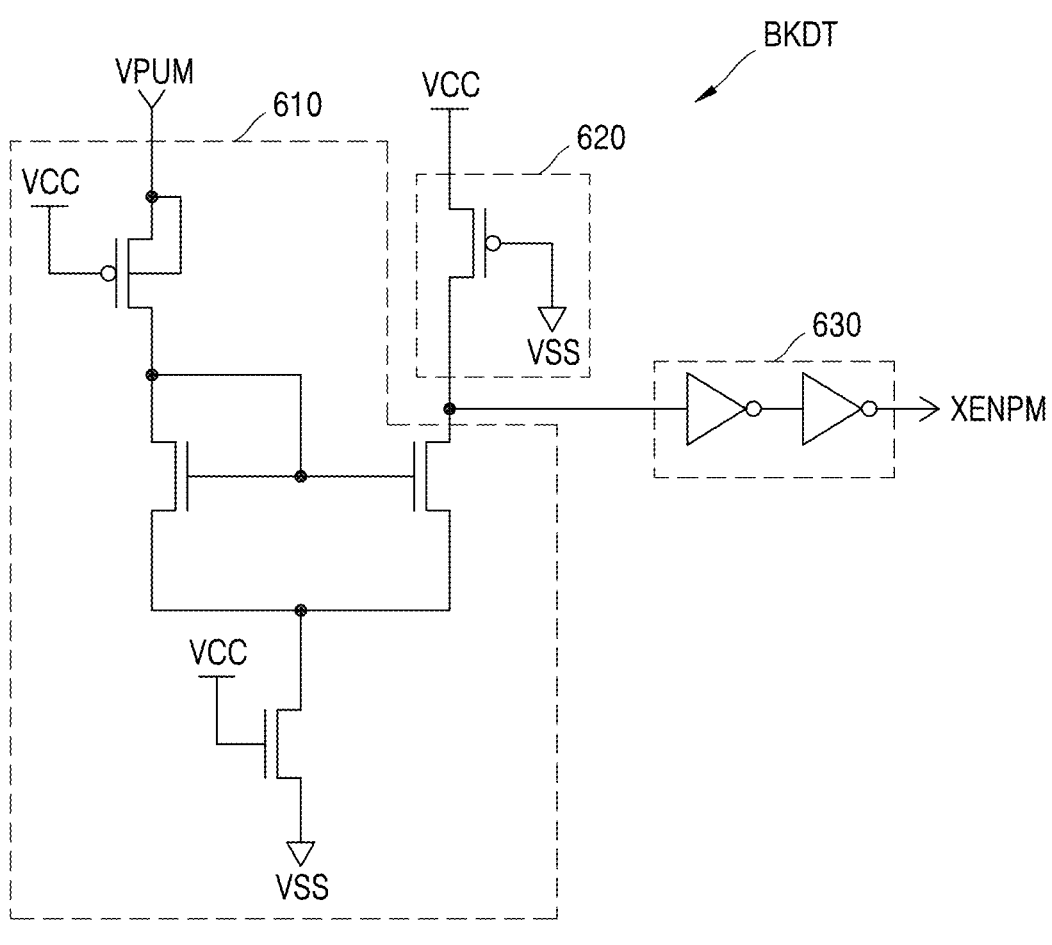
FIG. 10 is a schematic diagram illustrating an example of the level detection block of FIG. 1.
Figure 11:
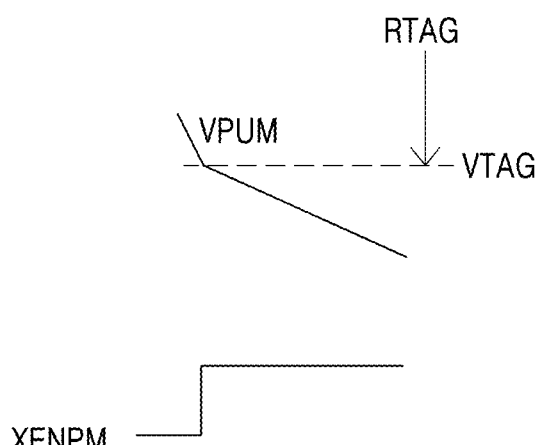
FIG. 11 is a schematic diagram illustrating activation of the pumping enable signal of the level detection block of FIG. 1.

FIG. 10 is a schematic diagram showing an example of the level detection block BKDT of FIG. 1. FIG. 11 is a schematic diagram illustrating activation of the pumping enable signal of the level detection block of FIG. 1. As shown in FIG. 10, the level detection block BKDT may include a current detection part 610, a bias part 620, and an output part 630.

The current detection part 610 may have a current mirror structure that uses the pumping voltage VPUM and the power supply voltage VCC as power sources. The bias part 620 may set a reference value for the value detected by the current detection part 610. The output part 630 may output the detection result of the current detection part 610, according to the reference value of the above bias part 620, as the pumping enable signal XENPM.

The operation of the above-mentioned level detection block BKDT is as follows.

The current flowing from the pumping voltage VPUM, which is input to the current sensing part 610, to the ground voltage VSS and the current flowing from the power supply voltage VCC, which is applied to the bias part 620, to the ground voltage (VSS) may be compared with each other.

When the current flowing from the pumping voltage VPUM to the ground voltage VSS is smaller than the current flowing from the power supply voltage VCC to the ground voltage VSS, the pumping enable signal XENPM may be activated to "H". When the current flowing from the pumping voltage VPUM to the ground voltage VSS is greater than the current flowing from the power supply voltage VCC to the ground voltage VSS, the pumping enable signal XENPM may be deactivated to "L"

As a result, the pumping enable signal XENPM may be activated as the level of the pumping voltage VPUM is outside a target range RTAG, as illustrated in FIG. 11. For example, when the pumping voltage VPUM is a boosted voltage, and the boosted voltage becomes lower than the target level VTAG, the pumping enable signal XENPM may be activated to "H".

The "target level VTAG" means the level of the pumping voltage VPUM when the current flowing from the pumping voltage VPUM to the ground voltage VSS becomes equal to the current flowing from the power supply voltage VCC to the ground voltage VSS.

A process in which the total pumping force F-tot is controlled in response to the self-refresh charge consumption in the pumping voltage generating circuit of the disclosure is described.

In this embodiment, it is assumed that at the present point in time, the data value of the 1-st driving information bit CDBIT<1> is '0', the data value of the 2-nd driving information bit CDBIT<2> is '1', and the data value of the 3-rd driving information bit CDBIT<3> is '0'. For example, at the present point in time, the 2-nd pumping driving part 410<2> of the pumping driver 400 may be enabled, and the total pumping force F-tot may be equal to the 2-nd partial pumping driving power F_par<2>.

First, the amount of charge pumped to the pumping voltage VPUM by the pumping driver 400 may be smaller than the self-refresh charge consumption.

In this case, as in CASE11 of FIG. 3, the number of pulses of the refresh sequential signal XSRF, which are generated during the generation of pulses of the pumping enable signal XENPM which have the pumping reference number N_rfp may be smaller than the first refresh pulse number N_rfr1. In this case, the first pulse number confirmation signal XSTA1 and the second pulse number confirmation signal XSTA2 are in the deactivated state of "L". The update pulse signal XUDP may be activated as a pulse.

The first input value IVA1, the second input value IVA2, and the input carry value ICA input to the 1-st full adder 210<1> and the addition output value USM and the output carry value UCA output from the 1-st full adder 210<1> are as shown in (Table 2).

TABLE 2

| IVA1 | IVA2 | ICA | USM | UCA |
|------|------|-----|-----|-----|
| 0 | 1 | 0 | 1 | 0 |

The first input value IVA1, the second input value IVA2, and the input carry value ICA input to the 2-nd full adder 210<2> and the addition output value USM and the output carry value UCA output from the 2-nd full adder 210<2> are as shown in (Table 3).

TABLE 3

| IVA1 | IVA2 | ICA | USM | UCA |
|------|------|-----|-----|-----|
| 1 | 0 | 0 | 1 | 0 |

The first input value IVA1, the second input value IVA2, and the input carry value ICA input to the 3-rd full adder 210<3> and the addition output value USM and the output carry value UCA output from the 3-rd full adder 210<3> are as shown in (Table 4).

TABLE 4

| IVA1 | IVA2 | ICA | USM | UCA |
|------|------|-----|-----|-----|
| 0 | 0 | 0 | 0 | 0 |

For example, the data value of each of the 1-st to 3-rd driving information bits CDBIT<1:3> may be updated from (0, 1, 0) to (1, 1, 0).

Accordingly, the total pumping driving force F-tot may also be updated as the sum of the 1-st partial pumping driving force F_par<1> and the 2-nd partial pumping driving force F_par<2>.

For example, the amount of charge pumped to the pumping voltage VPUM by the pumping driver 400 may increase, and the difference with the self-refresh charge consumption decreases.

In this case, the period of the pumping enable signal XENPM may increase. In other words, the point in time when the number of pulses of the pumping enable signal XENPM which have the pumping reference number N_rfp may be delayed.

By repeating a process similar to the above, the number of pulses of the refresh sequential signal XSRF, which are generated during the generation of pulses of the pumping enable signal XENPM which have the pumping reference number N_rfp may fall within the "target pulse number range RPTAG".

The amount of charge pumped to the pumping voltage VPUM by the pumping driver 400 may be greater than the self-refresh charge consumption.

In this case, as in CASE12 of FIG. 3, the number of pulses of the refresh sequential signal XSRF, which are generated during the generation of pulses of the pumping enable signal XENPM which have the pumping reference number N_rfp may be greater than the second refresh pulse number N_rfr2. In this case, the first pulse number confirmation signal XSTA1 and the second pulse number confirmation signal XSTA2 may be in the activated state of "H". The update pulse signal XUDP may be activated as a pulse.

The first input value IVA1, the second input value IVA2, and the input carry value ICA input to the 1-st full adder 210<1> and the addition output value USM and the output carry value UCA output from the 1-st full adder 210<1> are as shown in (Table 5).

TABLE 5

| IVA1 | IVA2 | ICA | USM | UCA |
|------|------|-----|-----|-----|
| 0 | 0 | 1 | 1 | 0 |

The first input value IVA1, the second input value IVA2, and the input carry value ICA input to the 2-nd full adder 210<2> and the addition output value USM and the output carry value UCA output from the 2-nd full adder 210<2> are as shown in (Table 6).

TABLE 6

| IVA1 | IVA2 | ICA | USM | UCA |
|------|------|-----|-----|-----|
| 1 | 1 | 0 | 0 | 1 |

The first input value IVA1, the second input value IVA2, and the input carry value ICA input to the 3-rd full adder 210<3> and the addition output value USM and the output carry value UCA output from the 3-rd full adder 210<3> are as shown in (Table 7).

TABLE 7

| IVA1 | IVA2 | ICA | USM | UCA |
|------|------|-----|-----|-----|
| 0 | 1 | 1 | 0 | 1 |

For example, the data value of each of the 1-st to 3-rd driving information bits CDBIT<1:3> may be updated from (0, 1, 0) to (1, 0, 0).

Accordingly, the total pumping driving force F-tot may decrease to the 1-st partial pumping driving force F_par<1>.

For example, the amount of charge pumped to the pumping voltage VPUM by the pumping driver 400 may decrease, and the difference with the self-refresh charge consumption may decrease.

In this case, the period of the pumping enable signal XENPM may decrease. In other words, the point in time when the number of pulses of the pumping enable signal XENPM which have the pumping reference number N_rfp may become faster.

By repeating a process similar to the above, the number of pulses of the refresh sequential signal XSRF, which are generated during the generation of pulses of the pumping enable signal XENPM which have the pumping reference number N_rfp may fall within the "target pulse number range RPTAG".

Finally, this is the case where the amount of charge pumped to the pumping voltage VPUM by the pumping driver 400 may be similar to the self-refresh charge consumption. In this case, as in CASE13 of FIG. 3, the number of pulses of the refresh sequential signal XSRF, which are generated during the generation of pulses of the pumping enable signal XENPM which have the pumping reference number N_rfp may be greater than or equal to the first refresh pulse number N_rfr1 and be less than or equal to the second refresh pulse number N_rfr2.

In this case, the first pulse number confirmation signal XSTA1 may be in an activated state of "H", and the second pulse number confirmation signal XSTA2 may be in an inactivated state of "L". In this case, the pulse of the update pulse signal XUDP may not be generated.

For example, the data value of each of the 1-st to 3-rd driving information bits CDBIT<1:3> may be maintained as (0, 1, 0). Accordingly, the total pumping driving force F-tot may also be maintained as the 2-nd partial pumping driving force F_par<2>.

In the pumping voltage generating circuit of the disclosure, the difference between the number of pulses of the pumping enable signal XENPM and the number of pulses of the refresh sequential signal XSRF generated within a certain time may be controlled within an allowable error range. For example, in the pumping voltage generating circuit of the disclosure, the total pumping force may be controlled as the strength such that the amount of charge supplied to the pumping voltage in the self-refresh operation is similar to the amount of self-refresh charge consumption. In other words, according to the pumping voltage generating circuit of the disclosure, the total pumping driving force may be controlled in response to the self-refresh charge consumption. As a result, a malfunction and an overshoot of the semiconductor memory device may be reduced.

It will be apparent to those skilled in the art that various modifications can be made to the above-described embodiments of the disclosure without departing from the spirit or scope of the disclosure.

For example, in this specification, an embodiment is illustrated and described in which the number of pulses of the refresh sequential signal XSRF generated up to the point in time at which a certain number of pulses of the pumping enable signal XENPM are generated is checked, and the number of pulses of the refresh sequential signal XSRF generated within a certain period of time is made similar to the number of pulses of the refresh sequential signal XSRF.

However, the technical idea of the disclosure can also be implemented by an embodiment in which the number of pulses of the pumping enable signal XENPM generated up to the point in time at which a certain number of pulses of the refresh sequential signal XSRF are generated is checked, and the number of pulses of the pumping enable signal XENPM generated within a certain period of time is made similar to the number of pulses of the refresh sequential signal XSRF.

Thus, it is intended that the disclosure covering all such modifications comes within the scope of the appended claims and their equivalents.

What is claimed is:

1. A pumping voltage generating circuit of a semiconductor memory device that generates a pumping voltage, wherein the semiconductor memory device includes multiple memory cells arranged in a matrix structure formed by multiple word lines and multiple data lines, and the word lines are sequentially activated in response to the generation of multiple pulses of a refresh sequential signal in a self-refresh operation, the pumping voltage generating circuit comprising:

a control information generating block that receives a pumping enable signal and the refresh sequential signal and generates driving force control information, wherein the driving force control information is controlled so that a number of pulses of the refresh sequential signal falling within a target pulse number range is generated during the generation of pulses of the pumping enable signal which have a pumping reference number;

a pumping generation block that generates a pumping voltage with a total pumping force, wherein the total pumping force depends on a data value of the driving force control information; and a level detection block that detects a level of the pumping voltage and generates the pumping enable signal, wherein the pumping enable signal is activated in case that the level of the pumping voltage is outside a target level range, and is deactivated in case that the level of the pumping voltage falls within the target level range.

2. The pumping voltage generating circuit of claim 1, wherein the level of the pumping voltage is higher than a level of a power supply voltage.

3. The pumping voltage generating circuit of claim 1, wherein the level of the pumping voltage is lower than a level of a ground voltage.

4. The pumping voltage generating circuit of claim 1, wherein the control information generating block includes:

a pulse number monitor that receives the pumping enable signal and the refresh sequential signal and generates a first pulse number confirmation signal, a second pulse number confirmation signal, and a reset pulse signal, wherein the first pulse number confirmation signal is activated in case that the number of generated pulses of the refresh sequential signal is greater than or equal to a first refresh reference number while the pulses of the pumping enable signal which have the pumping reference number are generated, and the second pulse number confirmation signal is activated in case that the number of generated pulses of the refresh sequential signal is greater than or equal to a second refresh reference number while the pulses of the pumping enable signal which have the pumping reference number are generated, the target pulse number range is greater than or equal to the first refresh reference number and less than or equal to the second refresh reference number, and the reset pulse signal is activated as a pulse according to the generation of pulses of the pumping enable signal which have the pumping reference number; and an information generator that receives the first pulse number confirmation signal and the second pulse number confirmation signal and generates the driving force control information, wherein the data value of the driving force control information is controlled based on the first pulse number confirmation signal and the second pulse number confirmation signal, and is updated according to the generation of the pulse of the reset pulse signal.

5. The pumping voltage generating circuit of claim 4, wherein the pulse number monitor includes:

a first refresh confirmation part that receives the refresh sequential signal and generates the first pulse number confirmation signal, wherein the first pulse number confirmation signal is activated and held according to the generation of pulses of the refresh sequential signal which have the first refresh reference number while a sampling pulse signal is activated;

a second refresh confirmation part that receives the refresh sequential signal and generates the second pulse number confirmation signal, wherein the second pulse number confirmation signal is activated and held according to the generation of pulses of the refresh sequential signal which have the second refresh reference number while the sampling pulse signal is activated, and the second refresh reference number is greater than the first refresh reference number; and a sampling pulse generating part that receives the pumping enable signal and generates the sampling pulse signal, wherein the sampling pulse signal is activated as a pulse in response to the generation of pulses of the pumping enable signal which have the pumping reference number.

6. The pumping voltage generating circuit of claim 5, wherein the first refresh confirmation part includes:

a first refresh counting part that counts the generation of pulses of the refresh sequential signal, generates first refresh counting information, and is reset in response to the generation of pulses of the reset pulse signal;

a first refresh confirmation part that receives the first refresh counting information, generates a first refresh counting signal, and is reset in response to the generation of pulses of the reset pulse signal, wherein the first refresh counting signal is activated according to the generation of pulses of the refresh sequential signal which have more than the first refresh reference number; and a first sampling part that receives the first refresh counting signal and generates the first pulse number confirmation signal, wherein the first pulse number confirmation signal has a logic state that depends on a logic state of the first refresh counting signal that is sampled and held in response to the generation of pulses of the sampling pulse signal, wherein the second refresh confirmation part includes:

a second refresh counting part that counts the generation of pulses of the refresh sequential signal, generates second refresh counting information, and is reset in response to the generation of pulses of the reset pulse signal;

a second refresh confirmation part that receives the second refresh counting information, generates a second refresh counting signal, and is reset in response to the generation of pulses of the reset pulse signal, wherein the second refresh counting signal is activated according to the generation of pulses of the refresh sequential signal which have more than the second refresh reference number; and a second sampling part that receives the second refresh counting signal and generates the second pulse number confirmation signal, wherein the second pulse number confirmation signal has a logic state that depends on a logic state of the second refresh counting signal that is sampled and held in response to the generation of pulses of the sampling pulse signal, and wherein the sampling pulse generating part includes:

a pumping counting part that generates pumping counting information by counting the number of pulses of the pumping enable signal and is reset in response to the generation of pulses of the reset pulse signal;

a pumping confirmation part that receives the pumping counting information, generates a pumping counting signal, and is reset in response to the generation of pulses of the reset pulse signal, wherein the pumping counting signal is activated according to the generation of pulses of the pumping enable signal which have more than the pumping reference number; and a sampling pulse generating part that receives the pumping counting signal and generates the sampling pulse signal, wherein the sampling pulse signal is activated as a pulse in response to the activation of the pumping counting signal.

7. The pumping voltage generating circuit of claim 6, wherein the reset pulse signal is a signal delayed with respect to the sampling pulse signal.

8. The pumping voltage generating circuit of claim 5, wherein the driving force control information includes 1-st to m-th driving information bits (where 'm' is a natural number of 2 or more), and i-th driving information bit (where 'i' is a natural number between '2' and 'm') is an upper bit of (i−1)-th driving information bit, wherein the information generator includes:

1-st to m-th full adders that each generate its own addition output value and its own output carry value by fully adding its own first input value, its own second input value, and its own input carry value, wherein the own addition output value is a remainder obtained by dividing a sum of the own first input value, the own second input value, and the own input carry value by '2', and the own output carry value is a quotient obtained by dividing the sum of the own first input value, the own second input value, and the own input carry value by '2'; and 1-st to m-th information latches that each latch its own information input data and provide the own information input data as its own information output data, wherein the first input value of each of the 1-st to m-th full adders depends on a data value of the information output data of the 1-st to m-th information latches in response to the activation of an update pulse signal, wherein the second input value of the 1-st full adder corresponds to a first data value according to the activation of the first pulse number confirmation signal and the second pulse number confirmation signal, and corresponds to a second data value according to the deactivation of at least one of the first pulse number confirmation signal and the second pulse number confirmation signal, wherein the second input value of i-th full adder corresponds to the second data value according to the activation of the first pulse number confirmation signal and the second pulse number confirmation signal, and corresponds to the first data value according to the deactivation of at least one of the first pulse number confirmation signal and the second pulse number confirmation signal to "L", wherein the input carry value of the 1-st full adder corresponds to the second data value according to the activation of the first pulse number confirmation signal and the second pulse number confirmation signal, and corresponds to the first data value according to the deactivation of at least one of the first pulse number confirmation signal and the second pulse number confirmation signal, wherein the input carry value of the i-th full adder corresponds to an output carry value of (i−1)-th full adder, wherein the addition output value of each of the 1-st to m-th full adders is provided as a data value of the information input data of the 1-st to m-th information latches in response to the deactivation of the update pulse signal, and wherein the data value of the information output data of each of the 1-st to m-th information latches corresponds to a data value of the 1-st to m-th driving information bits.

9. The pumping voltage generating circuit of claim 4, wherein the pumping generation block includes:

an oscillator that is enabled by the activation of the pumping enable signal and generates a main oscillating signal, wherein the main oscillating signal oscillates on a constant cycle; and a pumping driver that generates the pumping voltage with the total pumping force.

10. The pumping voltage generating circuit of claim 9, wherein the driving force control information includes 1-st to m-th driving information bits (where 'm' is a natural number of 2 or more), and i-th driving information bit (where 'i' is a natural number between '2' and 'm') is upper bit of (i−1)-th driving information bit, wherein the pumping driver includes:

1-st to m-th pumping driving parts, wherein k-th pumping driving part (where 'k' is a natural number between '1' and 'm') is enabled in response to first data value of k-th driving information bit, and generates the pumping voltage by pumping with a k-th partial pumping force according to a pulse of the main oscillating signal, wherein the k-th partial pumping force is greater than a (k−1)-th partial pumping force, and wherein the total pumping force is greater than or equal to a sum of 1-st to m-th partial pumping forces.

11. The pumping voltage generating circuit of claim 10, wherein the k-th partial pumping force is twice (k−1)-th partial pumping force.

12. The pumping voltage generating circuit of claim 10, wherein the k-th pumping driving part includes:

a power pumping node;

a pumping capacitor having a side connected to the power pumping node;

a control signal generation part that is enabled in response to the first data value of the k-th driving information bit and generates a pumping boosting signal, a pumping pre-charge signal, and a pumping driving signal having a period according to the main oscillating signal, wherein the pumping boosting signal is connected to another side of the pumping capacitor, the pumping pre-charge signal is activated within a deactivation period of the pumping boosting signal, and the pumping driving signal is activated within an activation period of the pumping boosting signal;

a pumping pre-charge part that pre-charges the power pumping node to a pumping pre-charge level in response to the activation of the pumping pre-charge signal; and a pumping driving part that provides charge of the power pumping node to the pumping voltage in response to the activation of the pumping driving signal, wherein a capacity of the pumping capacitor of the k-th pumping driving part is twice a capacity of the pumping capacitor of (k−1)-th pumping driving part.

* * * * *